US008628820B2

(12) United States Patent
Medwick et al.

(10) Patent No.: US 8,628,820 B2
(45) Date of Patent: Jan. 14, 2014

(54) REFLECTIVE ARTICLE AND METHOD OF MAKING A REFLECTIVE ARTICLE

(75) Inventors: Paul A. Medwick, Glenshaw, PA (US); Andrew V. Wagner, Pittsburgh, PA (US); Gary J. Marietti, Cheswick, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 562 days.

(21) Appl. No.: 12/330,618

(22) Filed: Dec. 9, 2008

(65) Prior Publication Data
US 2009/0233106 A1    Sep. 17, 2009

Related U.S. Application Data

(60) Provisional application No. 61/035,587, filed on Mar. 11, 2008.

(51) Int. Cl.
*B05D 5/06* (2006.01)

(52) U.S. Cl.
USPC ........... 427/162; 427/165; 428/469; 428/472; 428/332

(58) Field of Classification Search
USPC .......................................... 427/162, 164, 165
See application file for complete search history.

(56) References Cited

U.S. PATENT DOCUMENTS

| | | | |
|---|---|---|---|
| 3,762,988 A | 10/1973 | Clock et al. | |
| 4,287,107 A | 9/1981 | Hermann et al. | |
| 4,379,040 A | 4/1983 | Gillery | |
| 4,547,432 A * | 10/1985 | Pitts et al. | 428/448 |
| 4,746,347 A | 5/1988 | Sensi | |
| 4,792,536 A | 12/1988 | Pecoraro et al. | |
| 4,861,669 A | 8/1989 | Gillery | |
| 4,898,789 A | 2/1990 | Finley | |
| 4,898,790 A | 2/1990 | Finley | |
| 4,900,633 A | 2/1990 | Gillery | |
| 4,920,006 A | 4/1990 | Gillery | |
| 4,938,857 A | 7/1990 | Gillery | |
| 4,963,012 A | 10/1990 | Tracy et al. | |
| 5,008,153 A | 4/1991 | Hayes | |

(Continued)

FOREIGN PATENT DOCUMENTS

| | | |
|---|---|---|
| EP | 0 303 109 A2 | 7/1988 |
| WO | 2007007570 A1 | 1/2007 |
| WO | WO 2007007570 A1 * | 1/2007 |
| WO | 2007013269 A1 | 2/2007 |

OTHER PUBLICATIONS

PCT International Search Report mailed Jun. 16, 2009 in reference to International Application No. PCT/US2009/036596 filed Mar. 10, 2009.

(Continued)

*Primary Examiner* — Dah-Wei Yuan
*Assistant Examiner* — Jose Hernandez-Diaz
(74) *Attorney, Agent, or Firm* — Andrew C. Siminerio

(57) ABSTRACT

A reflective article, such as a solar mirror, includes a highly transparent substrate having a first major surface and a second major surface. At least one reflective coating is formed over at least a portion of one of the surfaces, e.g., the second major surface (or, alternatively, the first major surface). The reflective coating includes at least one metallic layer. An encapsulation structure can be formed over at least a portion of the second reflective coating.

18 Claims, 4 Drawing Sheets

(56) References Cited

U.S. PATENT DOCUMENTS

| | | | |
|---|---|---|---|
| 5,030,593 | A | 7/1991 | Heithoff |
| 5,030,594 | A | 7/1991 | Heithoff |
| 5,201,926 | A | 4/1993 | Szczyrbowski et al. |
| 5,240,886 | A | 8/1993 | Gulotta et al. |
| 5,328,768 | A | 7/1994 | Goodwin |
| 5,385,872 | A | 1/1995 | Gulotta et al. |
| 5,393,593 | A | 2/1995 | Gulotta et al. |
| 5,492,750 | A | 2/1996 | Shumaker, Jr. et al. |
| 6,027,766 | A * | 2/2000 | Greenberg et al. ............ 427/226 |
| 6,142,642 | A * | 11/2000 | Krisko et al. ................. 359/883 |
| 6,869,644 | B2 | 3/2005 | Buhay et al. |
| 6,916,542 | B2 | 7/2005 | Buhay et al. |
| 6,962,759 | B2 | 11/2005 | Buhay et al. |
| 7,054,065 | B2 * | 5/2006 | Wolfe et al. ................... 359/572 |
| 7,189,460 | B2 | 3/2007 | Shin et al. |
| 7,311,961 | B2 | 12/2007 | Finley et al. |
| 2002/0008914 | A1 | 1/2002 | Tatsumi |
| 2002/0160206 | A1 | 10/2002 | Hasegawa et al. |
| 2002/0172775 | A1 | 11/2002 | Buhay et al. |
| 2003/0152782 | A1 | 8/2003 | Kurobe et al. |
| 2003/0228476 | A1 | 12/2003 | Buhay et al. |
| 2005/0008852 | A1 * | 1/2005 | Hartig ............................ 428/336 |
| 2006/0003174 | A1 * | 1/2006 | Yashiki et al. ................ 428/472 |
| 2006/0029754 | A1 * | 2/2006 | Medwick et al. ............... 428/34 |
| 2006/0077580 | A1 * | 4/2006 | Wuillaume et al. ........... 359/883 |
| 2006/0269661 | A1 * | 11/2006 | Butz et al. ..................... 427/162 |
| 2007/0020465 | A1 * | 1/2007 | Thiel et al. .................... 428/428 |
| 2008/0112051 | A1 * | 5/2008 | Morimoto et al. ............. 359/507 |
| 2008/0175895 | A1 | 7/2008 | Kogure et al. |

OTHER PUBLICATIONS

U.S. Appl. No. 12/330,580, filed Dec. 9, 2008, Paul A. Medwick et al, Reflective Article.

U.S. Appl. No. 12/330,651, filed Dec. 9, 2008, Paul A. Medwick et al, Reflective Article Having Multiple Reflective Coatings.

* cited by examiner

REFLECTIVE ARTICLE AND METHOD OF MAKING A REFLECTIVE ARTICLE

CROSS REFERENCE TO RELATED APPLICATION

This application claims priority to U.S. Provisional Application No. 61/035,587, filed Mar. 11, 2008, herein incorporated by reference in its entirety. This application is also related to U.S. application Ser. No. 12/330,580, entitled "Reflective Article", and U.S. application Ser. No. 12/330,651, entitled "Reflective Article Having Multiple Reflective Coatings", both of which applications are also herein incorporated by reference in their entirety.

BACKGROUND OF THE INVENTION

1. Field of the Invention

This invention relates generally to coated substrates and, in one particular embodiment, to a coated glass substrate particularly useful for the reflection of electromagnetic radiation, such as electromagnetic solar radiation.

2. Technical Considerations

With the increasing costs of fossil-based fuels, solar power is becoming a more commercially acceptable and economically viable source of energy. One known application is using mirrors to concentrate solar power for electrical generation. Mirrors having high reflectance of solar radiation are used for "concentrated solar thermal power" (CSTP) installations. There are several different mirror geometries used for these applications. One conventional system uses curved parabolic solar mirrors to concentrate solar energy onto tubes positioned along a focal line. A heat transfer medium in the tubes carries the absorbed heat energy to a generator station where it is used for power generation. Another conventional system uses a solar tower in which a number of flat solar mirrors direct solar energy at a particular location on the tower. The heat generated by the focused solar energy is transferred to a working fluid, such as sodium, and the heated working fluid is used for power generation.

Another application of such mirrors is for "concentrated photovoltaics" (CPV). In this application, mirrors focus or concentrate solar energy onto high-efficiency photovoltaic (PV) devices, thereby improving the energy output per device.

In these known systems, it is desirable that the mirrors reflect as much solar energy as possible. It is also desirable that the mirrors have as long a commercial life as possible to preclude frequent changing of the mirrors.

Conventional mirror technology utilizes a wet chemical application process in which silver is precipitated onto a glass substrate from a silver nitrate solution. A problem with this known system is that the spent solution must be disposed of in an environmentally friendly manner. Moreover, such conventional systems do not permit the coated article to be processed at high temperatures (e.g., for heat-strengthening, tempering or bending) after deposition of the silver layer because this will damage the silver layer. While some conventional mirrors have a wet-chemical applied copper layer over the silver layer to retard corrosion of the silver, these conventional copper layers cannot protect the silver layer sufficiently to allow the coated glass to be heated to its softening point. Further, the deposition of copper by wet chemistry is unattractive due to environmental reasons, particularly due to disposal of the wet chemical waste stream.

Therefore, it would be advantageous to provide a reflective article and a method of making a reflective article which eliminate or reduce at least some of the problems associated with such conventional articles.

SUMMARY OF THE INVENTION

A method of making a reflective article comprises: providing a transparent glass substrate having a first major surface and a second major surface and forming a coating stack over at least a portion of the substrate. The coating stack comprises a basecoat formed over at least a portion of the second major surface, a primary reflective coating formed over at least a portion of the basecoat, and an inorganic protective coating formed over at least a portion of the primary reflective coating. The method further includes heating the coated substrate to at least a softening temperature of the glass substrate.

Another method of making a reflective article comprises: providing a transparent glass substrate having a first major surface and a second major surface; forming an inorganic basecoat over at least a portion of the second major surface, wherein the basecoat comprises at least one metal oxide selected from alumina, titania, zirconia, zinc oxide, zinc stannate, tin oxide, or mixtures or combinations thereof, and wherein the basecoat has a thickness in the range of 0.1 nm to 5 nm; forming a primary reflective coating over at least a portion of the basecoat, wherein the primary reflective coating comprises at least one metal selected from platinum, iridium, osmium, palladium, aluminum, gold, copper, silver, or mixtures, alloys, or combinations thereof, and wherein the primary reflective coating has a thickness in the range of 50 nm to 500 nm, and wherein the primary reflective coating is opaque to visible light; forming an anti-corrosion coating over at least a portion of the primary reflective coating, wherein the anti-corrosion coating comprises at least one metal or metal alloy from members of Groups 2-16 of the Periodic Table of the Elements and has a thickness in the range of 20 nm to 40 nm; forming a top coat over at least a portion of the anti-corrosion coating, wherein the top coat comprises at least one layer comprising a material selected from metal oxides, nitrides, oxynitrides, borides, fluorides, or carbides, and wherein the top coat has a thickness in the range of 5 nm to 500 nm; forming an inorganic protective coating over at least a portion of the top coat, wherein the protective coating comprises a material selected from silica, alumina, or a mixture of silica and alumina and has a thickness in the range of 50 nm to 500 nm; and heating the coated substrate to a temperature of at least 1000° F. to bend or heat treat the article, wherein the reflective article has a higher reflectance in a selected range of electromagnetic radiation after the heating step than before the heating step.

BRIEF DESCRIPTION OF THE DRAWINGS

The invention will be described with reference to the following drawing figures wherein like reference numbers identify like parts throughout.

DESCRIPTION OF THE PREFERRED EMBODIMENTS

Figure 1A:
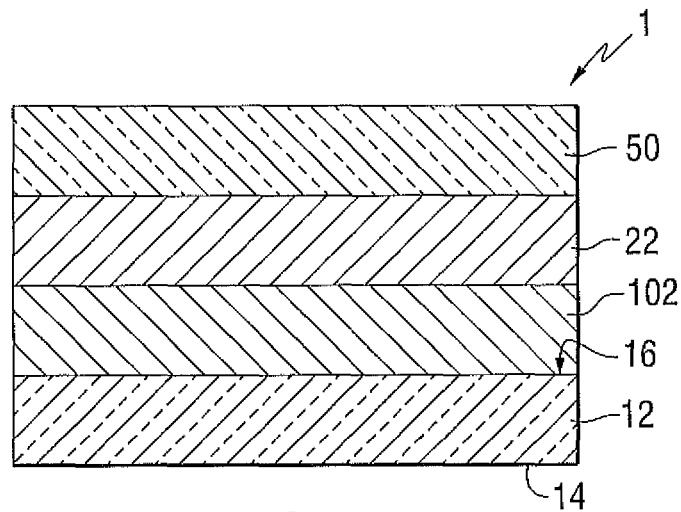
FIG. 1A is a side, sectional view (not to scale) of a reflective article incorporating features of the invention.

As used herein, spatial or directional terms, such as "left", "right", "inner", "outer", "above", "below", and the like, relate to the invention as it is shown in the drawing figures. However, it is to be understood that the invention can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like. Further, as used herein, the terms "formed over", "deposited over", or "provided over" mean formed, deposited, or provided on but not necessarily in direct contact with the surface. For example, a coating layer "formed over" a substrate does not preclude the presence of one or more other coating layers or films of the same or different composition located between the formed coating layer and the substrate. As used herein, the terms "polymer" or "polymeric" include oligomers, homopolymers, copolymers, and terpolymers, e.g., polymers formed from two or more types of monomers or polymers. The terms "visible region" or "visible light" refer to electromagnetic radiation having a wavelength in the range of 380 nm to 780 nm. The terms "infrared region" or "infrared radiation" refer to electromagnetic radiation having a wavelength in the range of greater than 780 nm to 100,000 nm. The terms "ultraviolet region" or "ultraviolet radiation" mean electromagnetic energy having a wavelength in the range of 100 nm to less than 380 nm. Additionally, all documents, such as but not limited to issued patents and patent applications, referred to herein are to be considered to be "incorporated by reference" in their entirety. Also, parameters such as "visible transmission" and "visible reflection" and the like are those determined using conventional methods. Those skilled in the art will understand that properties such as visible transmission or visible reflection can vary based on the physical dimensions, e.g., thickness, of the article being tested. Therefore, any comparison to the present invention should be calculated at an equivalent thickness.

For purposes of the following discussion, the invention will be discussed with reference to use with a reflective article to reflect electromagnetic radiation, such as but not limited to a solar mirror to reflect electromagnetic solar radiation. As used herein, the term "solar mirror" refers to any article configured to reflect electromagnetic solar radiation, such as visible and/or infrared and/or ultraviolet radiation, e.g., for use in concentrated solar power systems. However, it is to be understood that the invention is not limited to use with solar mirrors but could be practiced with articles in other fields, such as but not limited to laminated or non-laminated residential and/or commercial mirrors, or reflectors for high-performance optical systems (e.g., video projectors or optical scanners), just to name a few. Therefore, it is to be understood that the specifically disclosed exemplary embodiments are presented simply to explain the general concepts of the invention and that the invention is not limited to these specific exemplary embodiments.

In a broad aspect, the reflective article of the invention comprises at least some of the following components: (1) a light-transmitting substrate or superstrate having low absorption of solar radiation in the region(s) of the electromagnetic spectrum that it is desirable for the article to reflect, (2) one or more primary reflective layer(s) having high reflectivity of solar radiation in the region(s) of the electromagnetic spectrum that is desirable to be reflected, (3) optional "primer" or "blocker" or "barrier" layer(s) which can help preserve the reflective properties of the reflective layer(s) and/or improve the adhesion of adjacent components, (4) one or more optional secondary reflective layers such as additional metal, semiconductor, dielectric, and/or composite layers which can enhance the reflectivity of the article over some or all of the desired wavelength range and/or serve to protect the primary reflective layer(s) and/or serve to prevent diffusion of chemical species between layers and/or substrates/superstrates, (5) optional corrosion-inhibiting layer(s), (6) optional sacrificial layer(s) comprising materials which exhibit greater propensity to corrode than the materials comprising components 2, 3, and/or 4, (7) optional layer(s) of materials (e.g. metal or metal alloys) which are corrosion-resistant and/or form passivation layers that prevent chemically-reactive environmental species from interacting/reacting with other components, (8) optional encapsulation layer(s) which protect underlying layers (especially reflective layer(s)) from attack by environmental hazards (e.g. atmospheric pollutants, water, mechanical hazards), (9) optional adhesive layer(s) which bond the article to optional underlying lamina/plies/substrates/superstrates or other supporting structures, (10) optional polymeric layer(s), (11) optional additional lamina/plies/substrates/superstrates, (12) optional low-maintenance (e.g. hydrophillic and/or photocatalytic or hydrophobic) top surface, and (13) optional edge sealants.

A non-limiting reflective article incorporating features of the invention is illustrated in FIG. 1A and will be described herein as a solar mirror 1. The solar mirror 1 can have any desired reflectance or transmittance in the region(s) of interest within the electromagnetic spectrum (e.g., ultraviolet, visible, near infrared, far infrared, microwave, radiowave, etc.). For example, the solar mirror 1 can have a visible light reflection at a wavelength of 550 nm of at least 85%, such as at least 90%, such as at least 95%.

In the embodiment illustrated in FIG. 1A, the solar mirror 1 includes a substrate or ply 12 with a first major surface 14, i.e. an outer major surface, and an opposed second major surface 16, i.e. an inner major surface. In the following discussion, the first major surface 14 faces the incident radiation and the second surface 16 faces opposite the direction of the incident radiation. An optional basecoat 102 can be provided over at least a portion of one of the major surfaces, such as the second major surface 16. In illustrated non-limiting embodiment, a primary reflective coating 22 is formed over at least a portion of the second major surface 16, e.g. over at least a portion of the basecoat 102, if present. A protective coating 50 is provided over at least a portion of the primary reflective coating 22. While in the illustrated embodiment the coatings are formed over the second major surface 16, it is understood that at least some of the coatings could alternatively be formed over the first major surface 14.

In the broad practice of the invention, the ply 12 can include any desired material having any desired characteristics. For example, the ply 12 can be transparent or translucent to visible light. By "transparent" is meant having a transmission of greater than 0% up to 100% in a desired wavelength range, such as visible light. Alternatively, the ply 12 can be translucent. By "translucent" is meant allowing electromagnetic radiation (e.g., visible light) to be transmitted but diffusing or scattering this radiation. Examples of suitable materials for the ply 12 include, but are not limited to, thermoplastic, thermoset, or elastomeric polymeric materials, glasses, ceramics, and metals or metal alloys, and combinations, composites, or mixtures thereof. Specific examples of suitable materials include, but are not limited to, plastic substrates (such as acrylic polymers, such as polyacrylates; polyalkylmethacrylates, such as polymethylmethacrylates, polyethylmethacrylates, polypropylmethacrylates, and the like; polyurethanes; polycarbonates; polyalkylterephthalates, such as polyethyleneterephthalate (PET), polypropyleneterephthalates, polybutyleneterephthalates, and the like; polysiloxane-containing polymers; or copolymers of any monomers for preparing these, or any mixtures thereof); ceramic substrates; glass substrates; or mixtures or combinations of any of the above. For example, the ply 12 can include conventional soda-lime-silicate glass, borosilicate glass, or leaded glass. The glass can be clear glass. By "clear glass" is meant non-tinted or non-colored glass. Alternatively, the glass can be tinted or otherwise colored glass. The glass can be annealed or heat-treated glass. As used herein, the term- "heat treated" means tempered, bent, heat strengthened, or laminated. The glass can be of any type, such as conventional float glass, and can be of any composition having any optical properties, e.g., any value of visible transmission, ultraviolet transmission, infrared transmission, and/or total solar energy transmission. The ply 12 can be, for example, clear float glass or can be tinted or colored glass. Although not limiting to the invention, examples of glass suitable for the ply 12 are described in U.S. Pat. Nos. 4,746,347; 4,792,536; 5,030,593; 5,030,594; 5,240,886; 5,385,872; and 5,393,593. The ply 12 can be of any desired dimensions, e.g., length, width, shape, or thickness. In one exemplary embodiment, the first ply 12 can be greater than 0 up to 10 mm thick, such as 1 mm to 10 mm thick, e.g., 1 mm to 5 mm thick, e.g., less than 4 mm thick, e.g., 3 mm to 3.5 mm thick, e.g., 3.2 mm thick. Additionally, the ply 12 can be of any desired shape, such as flat, curved, parabolic-shaped, or the like. Also, when the primary reflective layer(s) 22 reside on the second major surface 16 of the article, the ply 12 can comprise one or more materials that exhibit low absorption of electromagnetic radiation in the region(s) of electromagnetic radiation desired to be reflected.

In one non-limiting embodiment, the ply 12 can have a high visible light transmission at a reference wavelength of 550 nanometers (nm) and a reference thickness of 3.2 mm. By "high visible light transmission" is meant visible light transmission at 550 nm of greater than or equal to 85%, such as greater than or equal to 87%, such as greater than or equal to 90%, such as greater than or equal to 91%, such as greater than or equal to 92%, such as greater than or equal to 93%, such as greater than or equal to 95%, at 3.2 mm reference thickness for the ply. Particularly useful glass for the practice of the invention is disclosed in U.S. Pat. Nos. 5,030,593 and 5,030,594. Non-limiting examples of glass that can be used for the practice of the invention include, but are not limited to, Starphire®, Solarphire®, Solarphire® PV, Solargreen®, Solextra®, GL-20®, GL-35™, Solarbronze®, CLEAR, and Solargray® glass, all commercially available from PPG Industries Inc. of Pittsburgh, Pa.

The basecoat 102 can provide a stronger or more durable interface between the ply 12 and the primary reflective coating 22. The basecoat 102 can comprise one or more materials chosen such that the interface between the basecoat 102 and the primary reflective coating 22 is more mechanically, chemically, and/or environmentally stable than an interface between the ply 12 and the primary reflective layer 22. Also, the basecoat 102 can serve as a diffusion barrier to the elemental exchange between the ply 12 and the primary reflective coating 22 (such as the migration of sodium out of the glass substrate into the overlaying coating(s) or the migration of metal, e.g., silver, from the primary reflective coating 22 to the glass), especially as might occur as the result of subjecting the coated article to elevated temperatures, for example, for bending or heat strengthening. Additionally or alternatively, the basecoat 102 can provide a smoother or more planar surface upon which to deposit an overlaying coating, e.g., the primary reflective coating 22. Examples of materials suitable for the basecoat 102 include, but are not limited to, inorganic materials such as but not limited to transparent low absorption dielectrics, such as metal oxides or combinations, composites, or mixtures of metal oxides. Examples of suitable metal oxides include alumina, titania, zirconia, zinc oxide, zinc stannate, tin oxide, or mixtures or combinations thereof. Other examples for the basecoat 102 include one or more layers of silicon dioxide and/or silicon nitride. In one non-limiting embodiment, the basecoat 102 comprises titania. The basecoat 102 can have any composition or thickness to provide sufficient functionality to the article (e.g., mechanical, chemical, passivation, planarization, adhesion, diffusion barrier properties, environmental durability enhancement, optical). In one particular embodiment where the basecoat 102 is titania, the basecoat 102 has a thickness in the range of 0.1 nm to 5 nm, such as 0.1 nm to 3 nm, such as 0.5 nm to 3 nm, such as 1 nm to 3 nm, such as 0.5 nm to 2 nm, such as 1 nm to 2 nm, such as 1.5 nm to 2 nm, such as 1.8 nm.

The primary reflective coating 22 is formed over at least a portion of the second major surface 16, e.g., over at least a portion of the basecoat 102, if present. The primary reflective coating 22 comprises one or more inorganic or organic dielectrics, metals, or semiconductors selected to reflect one or more portions of the electromagnetic spectrum, such as one or more portions in the range of electromagnetic solar radiation. In one non-limiting embodiment, the primary reflective coating 22 comprises one or more radiation reflective metallic films or layers. Examples of suitable reflective metals include, but are not limited to, metallic platinum, iridium, osmium, palladium, aluminum, gold, copper, silver, or mixtures, alloys, or combinations thereof. In one non-limiting embodiment, the primary reflective coating 22 comprises a metallic silver layer having a thickness in the range of 50 nm to 500 nm, such as 50 nm to 300 nm, such as 60 nm to 400 nm, such as 60 nm to 300 nm, such as 70 nm to 300 nm, such as 80 nm to 200 nm, such as 80 nm to 150 nm, such as 90 nm to 150 nm, such as 90 nm to 140 nm, such as 90 nm to 130 nm, such as 100 nm to 130 nm, such as 120 nm to 130 nm. In one particular non-limiting embodiment, the primary reflective coating 22 comprises metallic silver and has a thickness of at least 50 nm, such as at least 60 nm, such as at least 70 nm, such as at least 80 nm (for example, in the range of 70 nm to 90 nm). The primary reflective coating 22 can be deposited to a thickness such that the article 1 has any particular desired level of reflectance in the desired range of electromagnetic radiation to be reflected. The primary reflective coating 22 can be deposited to a thickness sufficient that the primary coating 22 is opaque in a desired wavelength range, such as visible light. The primary reflective coating 22 can be particularly useful in reflecting visible and solar infrared energy. In one particular non-limiting embodiment, the primary reflective coating 22 is deposited by a conventional sputtering process, as described in more detail below. In another non-limiting embodiment, the primary reflective coating 22 can comprise a "high reflector" comprising a plurality of alternating high and low refractive index materials.

The protective coating 50 assists in protecting the underlying layers, such as the primary reflective layer 22, from mechanical and chemical attack during manufacture, transit, handling, processing, and/or during the mirror's service life in the field. The protective coating 50 also helps protect the underlying layers from the ingress of liquid water, water vapor, and other environmental pollutants (be they solid, liquid or gas). The protective coating 50 can be an oxygen barrier coating layer to prevent or reduce the passage of ambient oxygen into the underlying layers during subsequent processing, e.g., such as during heating or bending. The protective coating 50 can be of any desired material or mixture of materials, such as but not limited to one or more inorganic materials. In one exemplary embodiment, the protective coating 50 can include a layer having one or more metal oxide materials, such as but not limited to oxides of aluminum, silicon, or mixtures thereof. For example, the protective coating 50 can be a single coating layer comprising in the range of 0 wt. % to 100 wt. % alumina and/or 100 wt. % to 0 wt. % silica, such as 1 wt. % to 99 wt. % alumina and 99 wt. % to 1 wt. % silica, such as 5 wt. % to 95 wt. % alumina and 95 wt. % to 5 wt. % silica, such as 10 wt. % to 90 wt. % alumina and 90 wt. % to 10 wt. % silica, such as 15 wt. % to 90 wt. % alumina and 85 wt. % to 10 wt. % silica, such as 50 wt. % to 75 wt. % alumina and 50 wt. % to 25 wt. % silica, such as 50 wt. % to 70 wt. % alumina and 50 wt. % to 30 wt. % silica, such as 35 wt. % to 100 wt. % alumina and 65 wt. % to 0 wt. % silica, e.g., 70 wt. % to 90 wt. % alumina and 30 wt. % to 10 wt. % silica, e.g., 75 wt. % to 85 wt. % alumina and 25 wt. % to 15 wt. % of silica, e.g., 88 wt. % alumina and 12 wt. % silica, e.g., 65 wt. % to 75 wt. % alumina and 35 wt. % to 25 wt. % silica, e.g., 70 wt. % alumina and 30 wt. % silica, e.g., 60 wt. % to less than 75 wt. % alumina and greater than 25 wt. % to 40 wt. % silica. In one particular non-limiting embodiment, the protective coating 50 comprises 40 wt. % to 15 wt. % alumina and 60 wt. % to 85 wt. % silica such as 85 wt. % silica and 15 wt. % alumina. Other materials, such as aluminum, chromium, hafnium, yttrium, nickel, boron, phosphorous, titanium, zirconium, and/or oxides thereof, can also be present, such as to adjust the refractive index of the protective coating 50. In one non-limiting embodiment, the refractive index of the protective coating 50 can be in the range of 1 to 3, such as 1 to 2, such as 1.4 to 2, such as 1.4 to 1.8.

In one non-limiting embodiment, the protective coating 50 comprises a combination of silica and alumina. The protective coating 50 can be sputtered from two cathodes (e.g., one silicon and one aluminum) or from a single cathode containing both silicon and aluminum. This silicon/aluminum oxide protective coating 50 can be written as $Si_xAl_{1-x}O_{1.5+x/2}$, where x can vary from greater than 0 to less than 1. In one specific non-limiting embodiment, the protective coating 50 can be a silicon/aluminum oxide coating ($Si_xAl_{1-x}O_{1.5+x/2}$) having a thickness in the range of 5 nm to 5,000 nm, such as 5 nm to 1,000 nm, such as 10 nm to 100 nm, e.g., 10 nm to 50 nm, such as 10 nm to 40 nm, such as 20 nm to 30 nm, such as 25 nm. Further, the protective coating 50 can be of non-uniform thickness. By "non-uniform thickness" is meant that the thickness of the protective coating 50 can vary over a given unit area, e.g., the protective coating 50 can have high and low spots or areas. In another non-limiting embodiment, the protective coating 50 comprises a silicon/aluminum oxide coating or mixture of silica and alumina, such as 85 wt. % silica and 15 wt. % alumina, and has a thickness in the range of 10 nm to 500 nm, such as 20 nm to 300 nm, such as 50 nm to 300 nm, e.g., 50 nm to 200 nm, such as 50 nm to 150 nm, such as 50 nm to 120 nm, such as 75 nm to 120 nm such as 75 nm to 100 nm. In a particular non-limiting embodiment, the protective coating 50 can have a thickness of at least 50 nm, such as at least 75 nm, such as at least 100 nm, such as at least 110 nm, such as at least 120 nm, such as at least 150 nm, such as at least 200 nm.

In another non-limiting embodiment, the protective coating 50 comprises silica having a thickness in the range of 10 nm to 100 nm, such as 10 nm to 80 nm, such as 20 nm to 80 nm, such as 30 nm to 70 nm, such as 40 nm to 60 nm, such as 50 nm. In a further non-limiting embodiment, the protective coating 50 comprises silica having a thickness in the range of 10 nm to 500 nm, such as 10 nm to 400 nm, such as 20 nm to 300 nm, such as 50 nm to 200 nm, such as 75 nm to 150 nm, such as 75 nm to 120 nm.

In another non-limiting embodiment, the protective coating 50 can comprise a multi-layer structure, e.g., a first layer with at least one second layer formed over the first layer. In one specific non-limiting embodiment, the first layer can comprise alumina or a mixture or alloy comprising alumina and silica. For example, the first layer can comprise a silica/alumina mixture having greater than 5 wt. % alumina, such as greater than 10 wt. % alumina, such as greater than 15 wt. % alumina, such as greater than 30 wt. % alumina, such as greater than 40 wt. % alumina, such as 50 wt. % to 70 wt. % alumina, such as in the range of 70 wt. % to 100 wt. % alumina and 30 wt. % to 0 wt. % silica, such as greater than 90 wt. % alumina, such as greater than 95 wt. % alumina. In one non-limiting embodiment, the first layer comprises all or substantially all alumina. In one non-limiting embodiment, the first layer can have a thickness in the range of greater than 0 nm to 1 micron, such as 5 nm to 10 nm, such as 10 nm to 25 nm, such as 10 nm to 15 nm. The second layer can comprise silica or a mixture or alloy comprising silica and alumina. For example, the second layer can comprise a silica/alumina mixture having greater than 40 wt. % silica, such as greater than 50 wt. % silica, such as greater than 60 wt. % silica, such as greater than 70 wt. % silica, such as greater than 80 wt. % silica, such as in the range of 80 wt. % to 90 wt. % silica and 10 wt. % to 20 wt. % alumina, e.g., 85 wt. % silica and 15 wt. % alumina. In one non-limiting embodiment, the second layer can have a thickness in the range of greater than 0 nm to 2 microns, such as 5 nm to 500 nm, such as 5 nm to 200 nm, such as 10 nm to 100 nm, such as 30 nm to 50 nm, such as 35 nm to 40 nm. In another non-limiting embodiment, the second layer can have a thickness in the range of greater than 0 nm to 1 micron, such as 5 nm to 10 nm, such as 10 nm to 25 nm, such as 10 nm to 15 nm. In another non-limiting embodiment, the protective coating 50 can be a bilayer formed by one metal oxide-containing layer (e.g., a silica and/or alumina-containing first layer) formed over another metal oxide-containing layer (e.g., a silica and/or alumina-containing second layer). The individual layers of the multi-layer protective coating can be of any desired thickness. Non-limiting examples of suitable protective coatings are described, for example, in U.S. patent application Ser. Nos. 10/007,382; 10/133,805; 10/397,001; 10/422,094; 10/422,095; and 10/422,096.

As discussed above, the reflective article of the invention can include one or more additional optional films, layers, coatings or structures. Additional reflective articles of the invention incorporating such additional structures will now be described. However, it is to be understood that the specific optional structures or coatings described are not limited to the particular illustrated embodiments but that these structures could be utilized interchangeably in any of the embodiments of the invention.

Figure 1B:
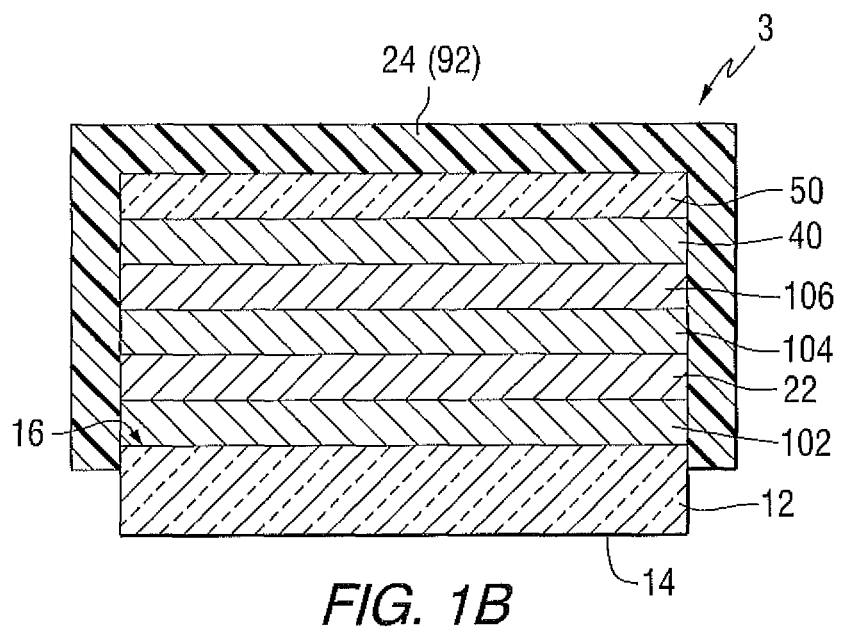
FIG. 1B is a side, sectional view (not to scale) of another reflective article incorporating features of the invention.

Another non-limiting reflective article incorporating features of the invention is illustrated in FIG. 1B as a solar mirror 3. In the embodiment illustrated in FIG. 1B, the solar mirror 3 includes a ply 12 with a first major surface 14, i.e. an outer major surface, and an opposed second major surface 16, i.e. an inner major surface, as described above. An optional basecoat 102 can be provided over at least a portion of one of the major surfaces, such as the second major surface 16. A primary reflective coating 22 is formed over at least a portion of the second major surface 16, e.g. over at least a portion of the basecoat 102, if present. One or more optional corrosion resistant or anti-corrosion coatings 104 can be provided, e.g., over at least a portion of the primary reflective coating 22. A primer film 106 can be provided over or under at least a portion of the anti-corrosion coating 104. A topcoat 40 can be provided over at least a portion of the anti-corrosion coating 104, e.g., over at least a portion of the primer film 106. A protective coating 50 can be provided over at least a portion of the topcoat 40. An optional encapsulation structure 24 can be provided over at least a portion of the protective coating 50. While only one anti-corrosion coating 104 is shown, the article could have multiple anti-corrosion coatings 104 and multiple primer films 106 either above and/or below the anti-corrosion coatings 104.

The ply 12, basecoat 102, primary reflective coating 22, and protective coating 50 can be as described above. However, in this embodiment, the reflective article 3 also comprises other layers having other functions.

For example, the anti-corrosion coating 104 can provide various benefits, such as corrosion inhibition and ultraviolet screening benefits. Also, the anti-corrosion coating 104 can provide some amount of electromagnetic energy reflection, which can permit a thinner primary reflective layer 22 to be used. The anti-corrosion coating 104 can also provide mechanical and/or chemical protection to the underlying coating layers. The anti-corrosion coating 104 can be provided under, over, or between one or more coating layers, e.g., the primary reflective coating(s) 22 or the top coat 40 (described below). Alternatively or in addition thereto, the anti-corrosion coating 104 can be provided under, over, or between one or more layers of a protective coating 50. It is believed that the anti-corrosion coating 104 increases the corrosion resistance of the underlying coatings, and/or enhances the visible light reflective of the solar mirror 3, and/or will block or reduce the passage of UV radiation. Examples of suitable materials for the anti-corrosion coating 104 include, but are not limited to, elemental metals and alloys of two or more metallic elements which are members of Groups 2-16 of the Periodic Table of the Elements, including, but not limited to, nickel and nickel-containing alloys, ferrous alloys and iron-containing alloys such as stainless steels, aluminum and aluminum-containing alloys, copper and copper-containing alloys, chromium and chromium-containing alloys, titanium and titanium-containing alloys, brasses such as Naval brass (an alloy of Cu, Zn and Sn), Admiralty brass (an alloy of Zn, Sn and Cu), and Aluminum brass (an alloy of Cu, Zn and Al), cobalt and cobalt-containing alloys such as alloys of cobalt and chromium, zinc and zinc-containing alloys, tin and tin-containing alloys, zirconium and zirconium-containing alloys, molybedenum and molybdenum-containing alloys, tungsten and tungsten-containing alloys, niobium and niobium-containing alloys, indium and indium-containing alloys, lead and lead-containing alloys, and bismuth and bismuth-containing alloys. Specific non-limiting embodiments include corrosion-resistant metals and metal alloys including, but not limited to, nickel and nickel-containing alloys such as Nickel 200, Inconel® alloys such as Inconel 600 and Inconel 625, stainless steels such as stainless steel 304 and stainless steel 316, Monel® alloys such as Monel 400, Hastelloy® alloys, cobalt and cobalt-containing alloys such as Stellite® alloys, Inco alloys such as Inco Alloy C-276 and Inco Alloy 020, Incoloy® alloys such as Incoloy 800 and Incoloy 825, copper and copper-containing alloys such as brasses especially Naval Brass (approximately 59% copper, 40% zinc, and 1% tin) and Admiralty Brass (approximately 69% copper, 30% zinc,1% tin), silicon and silicon-containing alloys, titanium and titanium-containing alloys, and aluminum and aluminum-containing alloys such as aluminum 6061. If present, the anti-corrosion coating(s) 104 can have any desired thickness. In some non-limiting embodiments, the anti-corrosion coatings 104 can have thicknesses in the range of, but not limited to, 1 nm to 500 nm, such as 1 nm to 400 nm, such as 1 nm to 300 nm, such as 1 nm to 200 nm, such as 1 nm to 100 nm, such as 10 nm to 100 nm, such as 20 nm to 100 nm, such as 30 nm to 100 nm, such as 40 nm to 100 nm, such as 50 nm to 100 nm, such as 20 nm to 40 nm, such as 30 nm to 40 nm, such as 30 nm to 35 nm. In other non-limiting embodiments, the anti-corrosion coating(s) 104 can have a thickness of at least 10 nm, such as at least 20 nm, such as at least 30 nm, such as at least 40 nm, such as at least 50 nm, such as at least 100 nm, such as at least 200 nm. In one particular non-limiting embodiment, the anti-corrosion coating(s) 104 comprise Inconel and can have a thickness in the range of 10 nm to 100 nm, such as 10 nm to 80 nm, such as 15 nm to 50 nm, such as 20 nm to 40 nm, such as 30 nm to 40 nm, such as 30 nm to 35 nm.

The optional primer layer 106 can be formed above and/or below the anti-corrosion coating(s) 104. The primer layer 106 is serves one or both of the following functions: (a) a chemical getter for oxygen or other chemical species (either endogenous or exogenous to the article) such that they react with the primer layer(s) rather than the primary reflective coating 22, and/or (b) a physical diffusion barrier to prevent chemical species from reaching and affecting (not necessarily by chemical reaction) the primary reflective coating 22. In one specific embodiment, the optional primer layer(s) 106 can comprise a metal or metal alloy which has a strong affinity for oxygen and/or the chemical reaction product of the metal or metal alloy with oxygen. The optional primer layer(s) 106 may also comprise materials which constitute a diffusion barrier so as to prevent the diffusion of molecular or atomic oxygen, water vapor, or other gaseous species from chemically reacting with the primary reflective coating 22. In one particular embodiment, the primer layer 106 comprises titanium, titanium oxide, or a mixture/combination thereof. In one particular embodiment, the primer layer 106 can have a thickness in the range of 0.1 to 10 nm, such as 0.5 to 5 nm, such as 0.5 to 4 nm, such as 0.5 to 2 nm, such as 1 nm to 2 nm.

The top coat 40 is formed over at least a portion of the primary reflective coating 22, e.g., over at least a portion of the anti-corrosion layer 104, e.g., over at least a portion of the primer layer 106. The top coat 40 can comprise one or more layers, e.g., one or more dielectric layers, such as one or more metal oxides, nitrides, oxynitrides, borides, fluorides, or carbides. In one non-limiting embodiment, the topcoat 40 can be a single layer comprising a zinc and tin oxide, such as zinc stannate. In another particular non-limiting embodiment, the top coat 40 can comprise a multi-film structure, as described below with respect to FIG. 1C. However, it is to be understood that the invention is not limited to oxide coatings. In one non-limiting embodiment, the topcoat 40 comprises zinc stannate. The top coat can have a thickness of at least 10 nm, such as at least 20 nm, such as at least 50 nm, such as at least 75 nm, such as at least 100 nm, such as at least 150 nm, such as at least 200 nm. In one particular non-limiting embodiment, the top coat can have a thickness in the range of 5 nm to 500 nm, such as 10 nm to 500 nm, such as 50 nm to 500 nm, e.g., 50 nm to 300 nm, such as 100 nm to 250 nm, such as 100 nm to 200 nm, such as 120 nm to 165 nm, such as 110 nm to 165 nm. Generally, the thicker the top coat, the more protection it provided to the underlying coating layers.

The optional encapsulation structure 24 can be formed over and/or around at least a portion of the coated ply 12 described above. In one non-limiting embodiment, the encapsulation structure 24 is formed at least partly by an encapsulating material 92. Suitable encapsulating materials 92 can include polymeric materials, inorganic materials, or composites, combinations, blends, mixtures, and alloys thereof. When a substantial portion or all of the encapsulation material 92 comprises a polymeric material, the encapsulation material 92 may be deposited by any conventional means, such as but not limited to, brush coating, roll coating, spray coating, curtain coating, dip coating, spin coating, knife-edge coating, screen printing, flood coating, electrocoating (a.k.a. electrodeposition), and powder coating. Suitable polymeric encapsulating materials 92 include, but are not limited to, thermoplastics, thermosets, elastomers, and thermoplastic elastomers formed by addition polymerization or condensation polymerization, with or without cross-linking, and copolymers, composites, combinations, mixtures, blends, and alloys thereof. However, encapsulants comprising polymeric materials may employ various additives and fillers including initiators, photoinitiators, plasticizers, stabilizers, preservatives, biocides, flattening agents, flow agents, antioxidants, UV absorbers, surfactants, dyes, pigments, and inorganic or organic fillers. Potential all-polymeric encapsulation materials may comprise, but are not limited to, polyacrylates, polyalkyds, polyacrylnitriles, polyesters, polyfluorocarbons, polyvinyls, polyureas, polymelamines, and polycarbonates. For example, the encapsulation structure 24 can include acrylic-based coatings, urethane-based coatings, fluropolymer and/or chlorofluoropolymer coatings (e.g. polyfluroethylene, polychlorotrifluoroethylene, etc), polyvinylidene chloride-based coatings, ethylene vinyl alcohol-based coatings, polyacrylonitrile-based coatings, cyclic olefin polymers or copolymer-based coatings, inorganic/organic composite coatings: organic polymer matrix with one or more inorganic phases (e.g. ceramics like silicon dioxide and aluminum oxide) dispersed within either uniformly or non-uniformly, plasma-sprayed inorganic coatings: ceramics (e.g. silicon dioxide, aluminum oxide, silicon nitride, titanium boride, titanium carbide, boron nitride, silicon carbide) and metals/metal alloys (aluminum, titanium, nickel-based alloys like Inconel, ferrous alloys like stainless steel), vulcanized butadiene-based coatings (e.g., synthetic rubber with sulfur crosslinking), UV-curable polysiloxane coatings, laminates comprising polymer interlayers (e.g. ethylene vinyl acetate or polyvinylidene chloride interlayers) and glass back plates. In one non-limiting embodiment, the polymeric material is free of heavy metals, such as lead. For encapsulants comprising all inorganic materials, suitable materials include, but are not limited to, metals, metal alloys, or ceramics and composites or combinations thereof. Examples of suitable processes to deposit such inorganic encapsulants include physical vapor deposition (e.g. sputter deposition, electron beam evaporation, thermal evaporation, cathodic arc deposition, plasma spray deposition, flame spray deposition, pyrolytic spray deposition, ion-assisted deposition), chemical vapor deposition (e.g. thermal CVD, plasma-assisted/plasma-enhanced CVD), sol-gel deposition, other wet-chemical processes (e.g. ceramic enamels), and combinations thereof. Further, the encapsulating structure 24 may comprise both polymeric and inorganic materials in combination.

Specific coatings suitable for the encapsulation structure 24 include, but are not limited to, the Corabond® family of coatings (such as Corabond® HC7707 coating) commercially available from PPG Industries, Inc. of Pittsburgh, Pa., Ferro GAL-1875 "Etch" ceramic enamel, Cosmichrome® coating (commercially available from Gold Touch, Inc.), Sureguard® mirror backing coating (commercially available from Spraylat Corporation), EcoBrite® ink coatings (commercially available from PPG Industries, Inc), PRC 4429 and PRC 4400 coatings commercially available from PRC DeSoto, and Spraylat Lacryl Series 700 or 800 coatings (available from Spraylat Corporation). Alternatively, the encapsulating structure 24 could be metallic, such as formed by one or more metallic layers, such as those described above with respect to the anti-corrosion coating 104, formed over the second reflective coating 22 with an optional polymeric material formed over the metallic layer(s). Additional examples of non-polymeric/inorganic encapsulants include ceramic enamels, sol-gel ceramic coatings, flame-sprayed ceramic or metallic coatings, plasma-sprayed ceramic or metallic coatings, and cathodic arc-sprayed ceramic or metallic coatings. In one specific non-limiting embodiment, the encapsulation structure 24 can be a multi-layer structure, such as a bilayer coating having a low lead-containing or lead free basecoat and a low lead-containing or lead free topcoat.

Figure 1C:
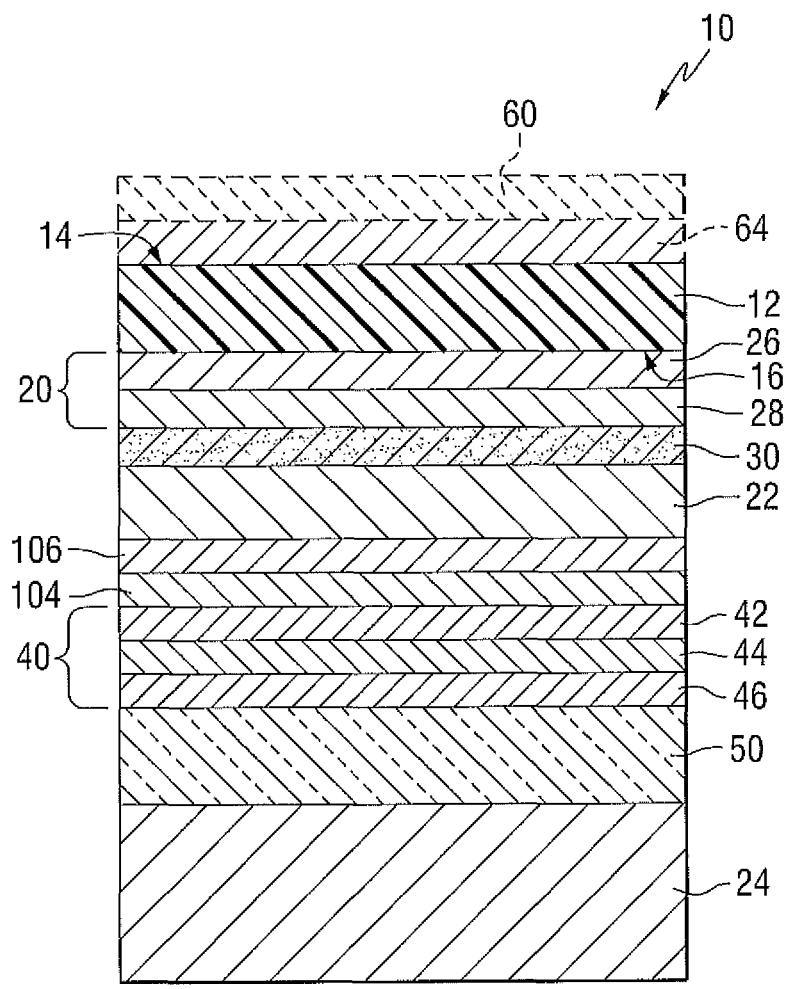
FIG. 1C is a side, sectional view (not to scale) of a further reflective article incorporating features of the invention.

A further non-limiting solar mirror 10 incorporating features of the invention is illustrated in FIG. 1C. In the embodiment illustrated in FIG. 1C, the solar mirror 10 includes a first ply 12 with a first major surface 14, i.e. an outer major surface, and an opposed second major surface 16, i.e. an inner major surface, as described above. In one non-limiting embodiment, an optional secondary reflective coating 20 is formed over at least a portion of the inner surface 16. In another non-limiting embodiment, the optional secondary reflective coating 20 can be formed over at least a portion of the outer major surface 14. A primary reflective coating 22 is formed over at least a portion of the second major surface 16, e.g. over at least a portion of the secondary reflective coating 20 if the secondary reflective coating 20 is present and on the second major surface 16. An anti-corrosion coating 104 can be formed over at least a portion of the primary reflective coating 22. A top coat 40 can be formed over at least a portion of the anti-corrosion coating 104. A protective coating 50 can be formed over at least a portion of the top coat 40. The mirror 10 can also include an encapsulating structure 24.

The optional secondary reflective coating 20, if present, can provide one or more functions in the solar mirror 10. In one non-limiting embodiment, the secondary reflective coating 20 can be selected to enhance the overall electromagnetic radiation reflection of the reflective article in a particular area or range of electromagnetic radiation. The secondary reflective coating 20 can be selected or designed to enhance the reflection of electromagnetic radiation in one or more portions of the electromagnetic spectrum (e.g. visible, infrared, ultraviolet). In one non-limiting embodiment, the secondary reflective coating 20 can be selected to enhance the reflection of short wavelength radiation, such as less than 600 nm, such as less than 550 nm, such as in the range of 400 nm to 550 nm. Alternatively, the secondary reflective coating 20 can be tuned, such as by varying its thickness, to reflect-UV radiation. The secondary reflective coating 20 can comprise one or more layers of reflective material, such as one or more layers of metal oxide materials. In one specific non-limiting embodiment, the secondary reflective coating 20 comprises alternating layers of a relatively high refractive index material and a relatively low refractive index material. A "high" refractive index material is any material having an index of refraction higher than that of the "low" refractive index material. In one non-limiting embodiment, a low refractive index material is a material having an index of refraction of less than or equal to 1.75. Non-limiting examples of low refractive index materials include silica, alumina, fluorides (such as magnesium fluoride and calcium fluoride) and alloys, mixtures or combinations thereof. In one non-limiting embodiment, a high refractive index material has an index of refraction greater than 1.75. Non-limiting examples of such materials include titania, zirconia, zinc stannate, silicon nitride, zinc oxide, tin doped zinc oxide, niobium oxide, tantalum oxide, and alloys, mixtures and combinations thereof. The secondary reflective coating 20 can be, for example but not limiting to the present invention, a multi-layer coating as shown in FIG. 1C having a first layer 26, e.g., a first dielectric layer, and a second layer 28, e.g., a second dielectric layer. In one non-limiting embodiment, the first layer 26 has a high refractive index and the second layer 28 has a low refractive index. In one non-limiting embodiment, the first layer 26 comprises titania and the second layer 28 comprises silica. In one specific non-limiting embodiment, the first layer, e.g., titania, has a thickness in the range of 15 nm to 35 nm, such 20 nm to 30 nm, such as 22 nm to 27 nm, such as 25 nm. The second layer, e.g., silica, can have a thickness in the range of 30 nm to 60 nm, such 35 nm to 50 nm, such as 40 nm to 50 nm, such as 42 nm. It is to be understood that the materials of the secondary reflective coating 20 are not limited to metal oxides. Any materials, such as but not limited to oxides, nitrides, oxynitrides, fluorides, etc. could be utilized.

In the non-limiting embodiment shown in FIG. 1C, an optional adhesive layer 30 can be provided between the secondary reflective coating 20 and the primary reflective coating 22. The adhesive layer 30 can be any layer that enhances the adhesion between the secondary and primary reflective coatings 20, 22 or improves the mechanical and/or chemical durability of the secondary or primary reflective coatings 20, 22. The adhesive layer 30 can comprise at least one material selected from dielectrics, semiconductors, polymers, organics, or layers of metal or metal alloys. In one non-limiting embodiment, the adhesive layer 30 comprises at least one material selected from oxides, nitrides, or oxynitrides of zinc, tin, titanium, or combinations thereof, such as but not limited to zinc oxide, titania, or a zinc/tin oxide such as zinc stannate. For example, the adhesive layer 30 can have a thickness of less than or equal to 5 nm, such as less than or equal to 4 nm, such as less than or equal to 3 nm, such as less than or equal to 2 nm, such as less than or equal to 1 nm.

In the illustrated exemplary embodiment shown in FIG. 1C, the top coat 40 is formed over at least a portion of the primary reflective coating 22. The top coat 40 can be as described above. In one specific non-limiting embodiment, the topcoat can comprise one or more layers, e.g., one or more dielectric layers, such as one or more metal oxides, nitrides, oxynitrides, borides, fluorides, or carbides. In one particular non-limiting embodiment, the top coat 40 comprises a multi-film structure having a first film 42, e.g., a metal oxide film, a second film 44, e.g., a metal alloy oxide or oxide mixture film, and optionally a third film 46, e.g., a metal oxide film. However, it is to be understood that the invention is not limited to oxide coatings and that other coatings, such as but not limited to nitrides or oxynitrides, could be used. In one non-limiting embodiment, the topcoat 40 can comprise zinc oxide or a zinc/tin oxide, such as zinc stannate, and can have a thickness in the range of 1 nm to 500 nm, such as 5 nm to 500 nm, such as 10 nm to 500 nm, such as 50 nm to 500 nm, e.g., 50 nm to 300 nm, such as 100 nm to 250 nm, such as 100 nm to 200 nm, such as 120 nm to 165 nm.

In one non-limiting embodiment, the first film 42 can be a zinc-containing film, such as zinc oxide. The zinc oxide film can be deposited from a zinc cathode that includes other materials to improve the conductivity and sputtering characteristics of the cathode. For example, the zinc cathode can include a small amount (e.g., 10 wt. % or less, such as 0 wt. % to 5 wt. %) of a conductive material, such as tin, to improve the sputtering characteristics of the cathode. In which case, the resultant zinc oxide film would include a small percentage of tin oxide, e.g., 0 to 10 wt. % tin oxide, e.g., 0 to 5 wt. % tin oxide. A coating layer deposited from a zinc cathode having 10 wt. % or less tin is referred to herein as "a zinc oxide" layer even though a small amount of the tin (e.g. 10 wt. %) may be present. The small amount of tin in the cathode is believed to form a small amount of tin oxide in the predominantly zinc oxide-containing film. In one non-limiting embodiment, the zinc oxide first film 42 comprises 90 wt. % zinc and 10 wt. % tin and has a thickness in the range of 1 nm to 200 nm, such as 1 nm to 150 nm, such as 1 nm to 100 nm, such as 1 nm to 50 nm, such as 1 nm to 25 nm, such as 1 nm to 20 nm, such as 1 nm to 10 nm, such as 2 nm to 8 nm, such as 3 nm to 8 nm, such as 4 nm to 7 nm, such as 5 nm to 7 nm, such as 6 nm.

In one non-limiting embodiment, the second film 44 can be a zinc/tin alloy oxide or zinc/tin oxide mixture film. The zinc/tin alloy oxide can be that obtained from magnetron sputtering vacuum deposition from a cathode of zinc and tin that can comprise zinc and tin in proportions of 10 wt. % to 90 wt. % zinc and 90 wt. % to 10 wt. % tin. One suitable metal alloy oxide that can be present in the second film 44 is zinc stannate. By "zinc stannate" is meant a composition of $Zn_xSn_{1-x}O_{2-x}$ (Formula 1) where "x" varies in the range of greater than 0 to less than 1. For instance, "x" can be greater than 0 and can be any fraction or decimal between greater than 0 to less than 1. For example where x=2/3, Formula 1 is $Zn_{2/3}Sn_{1/3}O_{4/3}$, which is more commonly described as "$Zn_2SnO_4$". A zinc stannate-containing film has one or more of the forms of Formula 1 in a predominant amount in the film. In one non-limiting embodiment, a zinc stannate second film 44 can have a thickness in the range of 1 nm to 200 nm, such as 1 nm to 150 nm, such as 1 nm to 100 nm, such as 1 nm to 50 nm, such as 1 nm to 25 nm, such as 1 nm to 20 nm, such as 5 nm to 15 nm, such as 6 nm to 14 nm, such as 8 nm to 14 nm, such as 10 nm to 14 nm, such as 11 nm to 13 nm, such as 12 nm.

In one non-limiting embodiment, the optional third film 46 can be zinc containing film similar to the first film 42, e.g., a zinc oxide film. In one non-limiting embodiment, the optional zinc oxide third film 46 has a thickness in the range of 1 nm to 200 nm, such as 1 nm to 150 nm, such as 1 nm 100 nm, such as 1 nm to 50 nm, such as 1 nm to 25 nm, such as 1 nm to 10 nm, such as in the range of 2 nm to 8 nm, such as in the range of 3 nm to 8 nm, such as in the range of 4 nm to 7 nm, such as in the range of 5 nm to 7 nm, such as 6 nm.

In one non-limiting embodiment, the solar mirror 10 can have a photoactive coating 60, such as a photocatalytic and/or photohydrophilic coating, formed over at least a portion of the first surface 14. A non-limiting example of one suitable material for the photoactive coating 60 is titania. The photoactive coating 60 can be deposited directly on the first surface 14 or a barrier layer, such as a sodium ion diffusion barrier (SIDB) layer 64 can be provided between the first surface 14 and the photoactive coating 60. A non-limiting example of a suitable SIDB layer material is silica or alumina or combinations thereof. Alternatively, the photoactive coating 60 can be eliminated and just the SIDB layer formed over the first surface 14.

Some or all of the coatings described above for the reflective articles of the invention can be deposited by any conventional method, such as but not limited to wet chemical methods (e.g. precipitation of the coating from solution, electroless plating, sol-gel chemistry, etc.), electrochemical methods (e.g. electroplating/electrodeposition), sputter deposition (e.g. magnetron sputter vapor deposition (MSVD)), evaporation (e.g. thermal or electron beam evaporation), chemical vapor deposition (CVD), spray pyrolysis, flame-spraying, or plasma-spraying In one non-limiting embodiment, some or all of the coatings can be deposited by MSVD. Examples of MSVD coating devices and methods will be well understood by one of ordinary skill in the art and are described, for example, in U.S. Pat. Nos. 4,379,040; 4,861,669; 4,898,789; 4,898,790; 4,900,633; 4,920,006; 4,938,857; 5,328,768; and 5,492,750. For example, the primary reflective coating 22 can be applied by wet chemical methods (e.g. "wet-silver" deposition—precipitation of silver from silver nitrate solution), if desired. In one non-limiting embodiment, one or more layers of the secondary reflective coating 20 can be applied by conventional CVD methods, for example on a float glass ribbon while the ribbon is in the tin bath. The primary reflective coating 22 and one or more layers of the top coat 40 can then be applied by a different process, such as MSVD. Alternatively, all of the coatings can be applied by the same process, such as by MSVD. It is believed that applying at least some of the coatings by sputtering has advantages over many other techniques. For example, it is possible to deposit a wide range of materials in a single vacuum chamber. Also, sputter deposition is expected to yield layers having higher chemical purity than conventional wet chemistry methods. Further, sputtering eliminates the liquid waste stream produced from wet chemical methods and also enables other metals to be easily deposited. Moreover, sputtering allows inorganic oxides to be deposited to be used for adhesion layers, chemical barriers and mechanical protection.

Figure 2:
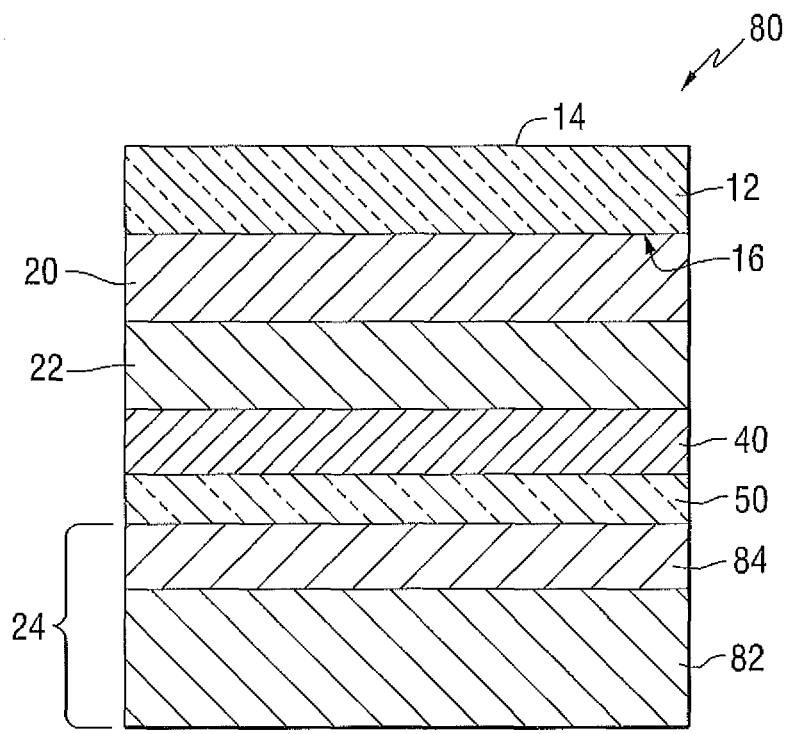
FIG. 2 is a side, sectional view (not to scale) of another reflective article of the invention.

The encapsulation structure 24 can be formed over and/or around at least a portion of the coated ply described above. The encapsulation structure 24 is not limited to the examples described above but could include any material to protect the underlying coating materials from chemical and or mechanical attack. For example, in the solar mirror 80 shown in FIG. 2, the encapsulation structure 24 includes a second ply 82 connected to the first ply 12, e.g., to the protective coating 50, by a polymeric layer 84. The second ply 82 can be selected from the materials described above for the first ply 12 and can be the same or different from the first ply 12. Additionally, the second ply 82 need not be transparent to electromagnetic radiation in any portion of the electromagnetic spectrum.

The polymeric layer 84 can be of any desired material and can include one or more layers or plies. The layer(s) 84 may comprise thermoplastics, thermosets, elastomers, and/or thermoplastic elastomers. The layer 84 can be a polymeric or plastic material, such as, for example, polyvinylbutyral, plasticized polyvinyl chloride, or multi-layered thermoplastic materials including polyethyleneterephthalate, ethylene vinyl acetate (EVA), polyvinyl chloride, polyvinylidene chloride, polycarbonate, polyacrylates (e.g. polymethylmethacrylate, polyacrylonitrile), polysiloxanes, fluoropolymers, polyesters, melamines, polyureas, polyurethanes, polyalkyds, polyphenol formaldehydes, etc. Suitable materials are disclosed in, but are not limited to, U.S. Pat. Nos. 4,287,107 and 3,762,988. The layer 84 secures the first and second plies together, can provide energy absorption, and can increase the strength of the laminated structure. In one non-limiting embodiment, the layer 84 is polyvinylbutyral and has a thickness in the range of 0.5 mm to 1.5 mm, such as 0.75 mm to 0.8 mm.

Figure 3:
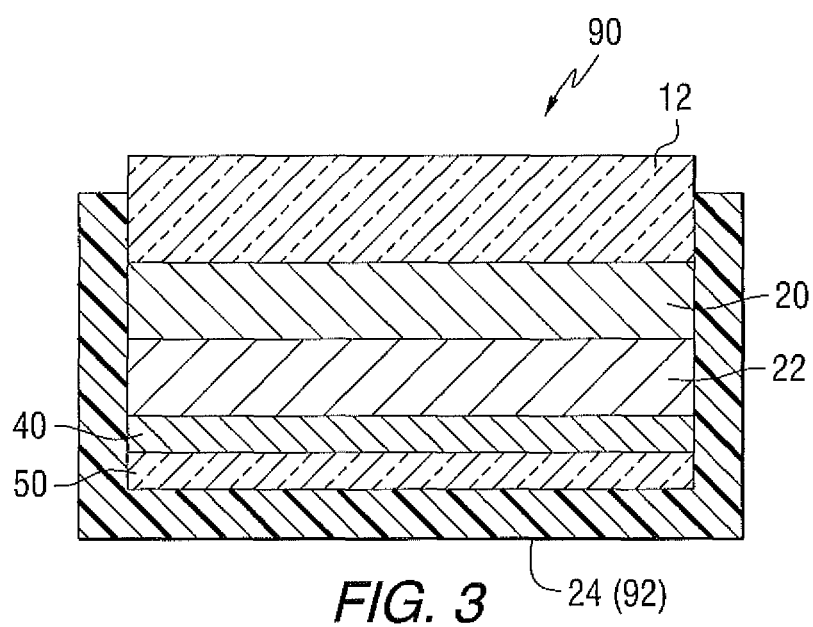
FIG. 3 is a side, sectional view (not to scale) of a further reflective article of the invention.

In the solar mirror 90 of the invention shown in FIG. 3, a polymeric encapsulation structure 24 formed at least partly by an encapsulating material 92 as described above can be used. The encapsulating material 92 can wrap around at least part of the sides (minor surfaces) of the solar mirror 90 providing an edge seal for the article. Alternatively, a conventional edge sealant, such as but not limited to polyvinylidene chloride (PVDC), can be applied to the edges, i.e., minor surfaces, of the article before the encapsulating material is applied.

Figure 4:
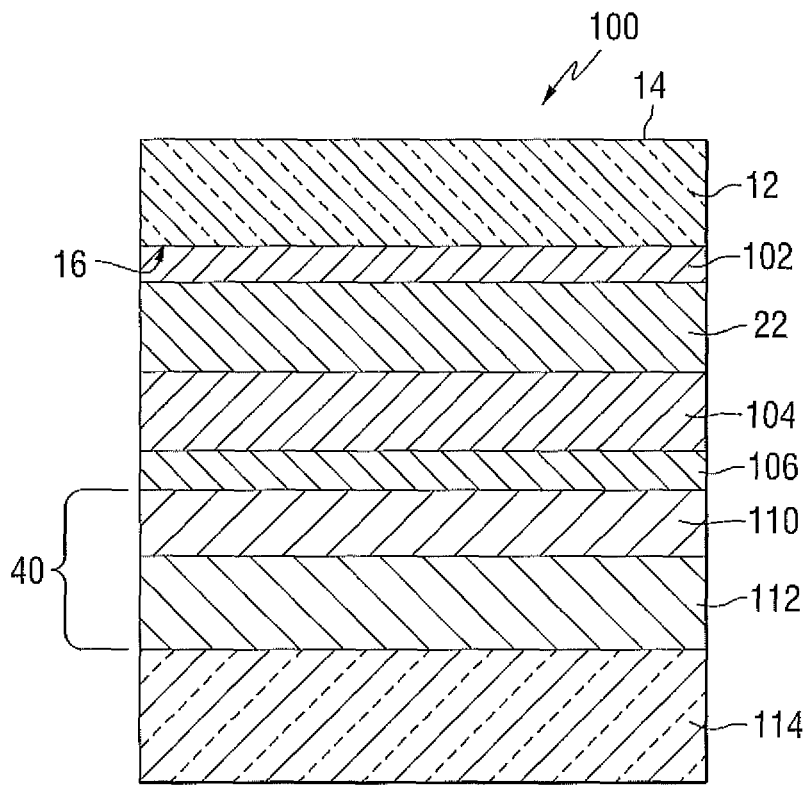
FIG. 4 is a side, sectional view (not to scale) of an additional reflective article of the invention.

Another solar mirror 100 of the invention is shown in FIG. 4. The solar mirror 100 includes a first ply 12 as described above. In this embodiment, the secondary reflective coating 20 is absent. The primary reflective coating 22 can be applied over at least a portion of the second major surface 16. In one particular embodiment, a basecoat 102 is provided between the second major surface 16 and the primary reflective coating 22. The basecoat 102 can be the same as described above.

In this embodiment, the primary reflective coating 22 can be any of the materials described above with reference to the earlier embodiments. In one particular embodiment, the primary reflective coating 22 comprises metallic silver having a thickness in the range of 10 nm to 500 nm, such as 50 nm to 500 nm, such 50 nm to 300 nm, such as 50 nm to 200 nm, such as 100 nm to 200 nm, such as 100 nm to 150 nm, such as 110 nm to 140 nm, such as 120 nm to 140 nm, such as 128 nm to 132 nm. In another particular embodiment, the primary reflective coating 22 comprises metallic silver having a thickness in the range of 1 nm to 500 nm, such as 50 nm to 500 nm, such 50 nm to 300 nm, such as 50 nm to 200 nm, such as 50 nm to 150 nm, such as 70 nm to 150 nm, such as 90 nm to 120 nm, such as 90 nm to 130 nm, such as 90 nm to 100 nm, such as 90 nm to 95 nm.

The top coat 40 can be a single layer or a multi-layer structure having a first layer 110 and a second layer 112. In one particular embodiment, the first metal oxide layer 110 comprises zinc oxide having a thickness in the range of 1 nm to 30 nm, such as 1 nm to 25 nm, such as 5 nm to 20 nm, such as 10 nm to 20 nm, such as 10 nm to 17 nm. The second layer 112 comprises zinc stannate having a thickness in the range of 10 nm to 100 nm, such as 40 nm to 45 nm.

The solar mirror 100 can also include a protective coating 114 which can be the same or similar to the protective coating 50 described above. In one particular embodiment, the protective coating 114 comprises silica having a thickness in the range of 10 nm to 500 nm, such as 10 nm to 300 nm, such as 10 nm to 100 nm, such as 20 nm to 100 nm, such as 30 nm to 80 nm, such as 40 nm to 60 nm, such as 50 nm to 60 nm, such as 57 nm.

Figure 5:
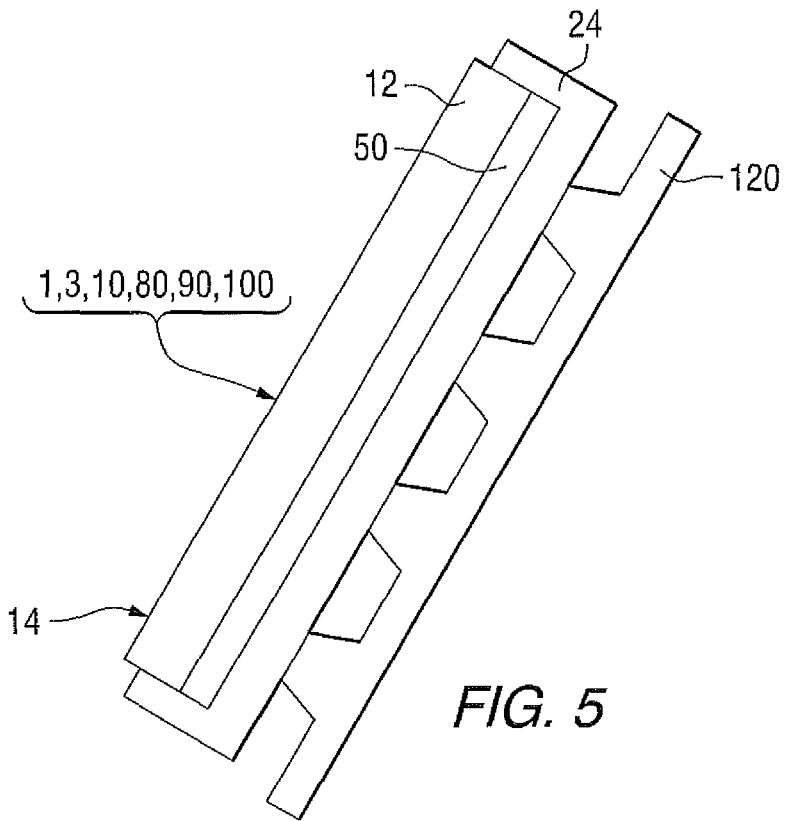
FIG. 5 is a side view (not to scale) of a reflective article of the invention attached to a base.

FIG. 5 shows a reflective article of the invention (e.g., a solar mirror 1, 3, 10, 80, 90, 100) of the invention mounted on a support base 120. The reflective article is mounted such that the first major surface 14 faces outwardly. The reflective article can be mounted in any conventional method, such as by an adhesive or by securing the article mechanically in a frame, just to name a few. The base 120 can be connected to the encapsulating structure 24 as described above. Alternatively, the encapsulating structure 24 can be eliminated and the base 120 connected with the outer coating layer of the coating stack, e.g., the protective coating 50. The base 120 can be of any desired material, such as, but not limited to metal (such as aluminum, stainless steel, etc.) or a polymeric material, such as plastic.

The invention provides highly reflective articles that are useful in many applications, such as but not limited to solar mirrors. The reflective articles of the invention can have a hemispherical solar-weighted, integrated Rg reflectance (WIRg) of at least 50%, such as at least 60%, such as at least 70%, such as at least 80%, such as at least 90%, such as at least 91%, such as at least 92%, such as at least 93%, such as at least 94%, such as at least 95%, such as in the range of 90% to 96%.

As described above and as shown in the following Examples, an advantage of the reflective article of the invention over conventional wet-chemical mirrors is that the reflective article of the invention can be coated and then heated to a temperature sufficient to heat treat or bend the coated article (prior to the application of any polymeric encapsulating structure) without adversely impacting upon the reflectance of the article. Also, coatings of the invention can exhibit an improvement in spectral performance (i.e. an increase in reflectance over some or all of the measured spectral range) and an increase in solar-weighted integrated reflectance after heating. For example, a reflective article of the invention having basecoat and/or primary reflective coating and/or secondary reflective coating and/or anti-corrosion coating and/or topcoat and/or protective coating can be heated to a temperature sufficient to bend or heat treat the article prior to application of the encapsulation structure. For example, the substrate and coatings could be heated to at least 300° F. (149° C.), such as at least 350° F. (177° C.), such as at least 400° F. (204° C.), such as at least 500° F. (260° C.), such as at least 750° F. (399° C.), such as at least 800° F. (427° C.), such as at least 900° F. (482° C.), such as at least 1000° F. (538° C.), such as at least 1022° F. (550° C.), such as at least 1100° F. (593° C.), such as at least 1200° F. (649° C.), such as at least 1300° F. (704° C.), such as in the range of 350° F. (177° C.) to 1300° F. (704° C.).

The invention will now be described with respect to specific examples illustrating various mirror structures incorporating various aspects of the invention. However, it is to be understood that the invention is not limited to these specific examples.

EXAMPLES

Table 1 shows the structure for various mirrors (Samples 1-10) of the invention.

TABLE 1

| Sample No. | $T_iO_2$ Basecoat | Ag | $T_i$ Primer | $T_iO_2$ | ZnO | $Zn_2SnO_4$ | Inconel 600 | $T_i$ Primer | $T_iO_2$ | ZnO | $Zn_2SnO_4$ | $S_i85/$ Al15 |
|---|---|---|---|---|---|---|---|---|---|---|---|---|
| 1 | 1.5 | 130 | 2.5 | 0 | 12 | 10 | 33 | 0 | 0 | 0 | 0 | 60 |
| 2 | 1.5 | 130 | 2.5 | 0 | 9 | 10 | 0 | 0 | 0 | 9 | 0 | 60 |
| 3 | 1.5 | 120 | 1.5 | 0 | 12 | 10 | 33 | 0 | 0 | 0 | 0 | 60 |
| 4 | 1.5 | 120 | 1.5 | 0 | 9 | 10 | 0 | 0 | 0 | 0 | 0 | 60 |
| 5 | 1.5 | 120 | 1.5 | 0 | 0 | 0 | 0 | 0 | 0 | 10 | 21 | 60 |
| 6 | 1.5 | 120 | 0 | 0 | 0 | 0 | 33 | 0 | 0 | 10 | 12 | 60 |
| 7 | 1.5 | 120 | 0 | 0 | 0 | 0 | 33 | 0 | 0 | 0 | 0 | 60 |
| 8 | 1.5 | 120 | 1.5 | 0 | 5 | 21 | 33 | 0 | 0 | 0 | 0 | 60 |
| 9 | 1.8 | 127 | 1.6 | 1.8 | 0 | 0 | 33 | 0 | 0 | 17 | 42 | 57 |
| 10 | 1.8 | 132 | 0 | 0 | 0 | 0 | 20 | 1 | 0 | 10 | 42 | 57 |
| 11 | 1.6 | 128 | 0 | 0 | 0 | 0 | 33 | 1 | 0 | 0 | 48 | 111 |
| 12 | 2 | 128 | 0 | 0 | 0 | 0 | 33 | 1 | 0 | 0 | 110-120 | 85-120 |
| 13 | 2 | 128 | 0 | 0 | 0 | 0 | 33 | 1 | 0 | 0 | 120-165 | 75-120 |
| 14 | 2 | 91 | 0 | 0 | 0 | 0 | 31 | 1 | 0 | 0 | 153 | 100 |
| 15 | 2 | 95 | 0 | 0 | 0 | 0 | 33 | 1 | 0 | 0 | 137 | 76 |

Table 2 shows the hemispherical WIRg reflectance (hemispherical solar-weighted, integrated Rg reflectance) of the mirrors of Samples 1-15 before and after heating. From these results, it appears that the hemispherical solar-weighted integrated reflectance of mirrors of the invention can increase upon heating. The "Softening Point" column means that the coated articles were placed in an oven at 1300° F. (704° C.) and heated (about 5 minutes) to the softening point of the glass (the maximum temperature of the coated surface was approximately 1185° F. (641° C.).

TABLE 2

| Sample No. | As Deposited (unheated) | | 30 mins @ 350° F. (177° C.) | | Softening Point | |
|---|---|---|---|---|---|---|
| | ASTM G-173-3AM-1.5D | ISO 9050 | ASTM G-173-3AM-1.5D | ISO 9050 | ASTM G-173-3AM-1.5D | ISO 9050 |
| 1 | 92.9 | 92.7 | 93.6 | 93.4 | 93.1 | 92.8 |
| 2 | 92.6 | 92.4 | 93.5 | 93.3 | 94.2 | 94.1 |
| 3 | Not Measured | Not Measured | Not Measured | Not Measured | Not Measured | Not Measured |
| 4 | Not Measured | Not Measured | Not Measured | Not Measured | Not Measured | Not Measured |

TABLE 2-continued

| | As Deposited (unheated) | | 30 mins @ 350° F. (177° C.) | | Softening Point | |
|---|---|---|---|---|---|---|
| Sample No. | ASTM G-173-3AM-1.5D | ISO 9050 | ASTM G-173-3AM-1.5D | ISO 9050 | ASTM G-173-3AM-1.5D | ISO 9050 |
| 5 | 92.8 | 92.6 | 93.4 | 93.3 | 93.8 | 93.6 |
| 6 | 92.8 | 92.6 | 93.4 | 93.3 | 93.9 | 93.8 |
| 7 | 92.9 | 92.7 | 93.5 | 93.4 | 93.9 | 93.7 |
| 8 | 92.9 | 92.7 | 93.5 | 93.3 | 88.5 | 88.1 |
| 9 | 92.7 | 92.4 | 93.7 | 93.5 | 94.2 | 94.0 |
| 10 | 93.1 | 92.9 | No Data | No Data | 93.9 | 93.8 |
| 11 | 94.0 | 93.8 | No Data | No Data | 95.5 | 95.3 |
| 12 | No Data | No Data | No Data | No Data | No Data | No Data |
| 13 | No Data | No Data | No Data | No Data | No Data | No Data |
| 14 | 93.7 | 93.4 | No Data | No Data | 95.4 | 95.2 |
| 15 | 94.0 | 93.7 | No Data | No Data | 95.4 | 95.2 |

It will be readily appreciated by those skilled in the art that modifications may be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

What is claimed is:

1. A method of making a reflective article, comprising:
    forming a coating stack over at least a portion of a transparent glass substrate having a first major surface configured to face incident radiation and a second major surface configured to face opposite a direction of incident radiation the coating stack comprising:
    a basecoat formed over at least a portion of the second major surface;
    a primary reflective coating formed over at least a portion of the basecoat, wherein said primary reflective coating is opaque to visible light;
    an inorganic protective coating formed over at least a portion of the primary reflective coating and comprising a mixture of silica and alumina; and
    a metallic anti-corrosion coating positioned between the primary reflective coating and the inorganic protective coating, wherein said anti-corrosion coating comprises a nickel-containing metal alloy, said anti-corrosion coating has a thickness in the range of 20 nm to 40 nm; and
    heating the coated substrate to at least a softening temperature of the glass substrate.

2. The method of claim 1, wherein the basecoat comprises an inorganic material.

3. The method of claim 2, wherein the basecoat comprises a transparent dielectric material.

4. The method of claim 1, wherein the primary reflective coating comprises at least one metallic film.

5. The method of claim 4, wherein the primary reflective coating comprises at least one metal selected from platinum, iridium, osmium, palladium, aluminum, gold, copper, silver, or mixtures, alloys, or combinations thereof.

6. The method of claim 1, wherein the protective coating has a thickness in the range of 75 nm to 120 nm.

7. The method of claim 1, including forming an encapsulation structure over at least a portion of the protective coating after the heating step, wherein the first major surface is free of the encapsulation structure.

8. The method of claim 7, wherein the encapsulation structure comprises a polymeric material.

9. The method of claim 1, including forming a top coat between the primary reflective coating and the protective coating prior to the heating step, the top coat comprising one or more dielectric layers.

10. The method of claim 9, wherein the top coat comprises at least one layer comprising a material selected from metal oxides, nitrides, oxynitrides, borides, fluorides, or carbides.

11. The method of claim 1, further comprising forming a photoactive coating over at least a portion of the first major surface.

12. The method of claim 1, including forming the primary reflective coating by a process selected from wet chemical deposition or sputter deposition.

13. The method of claim 12, including forming at least one of the other coatings of the coating stack by a different method than for forming the primary reflective coating.

14. The method of claim 1, including heating the coated article to at least 1000° F.

15. The method of claim 1, wherein the reflective article has a higher hemispherical solar-weighted, integrated Rg reflectance after the heating step than before the heating step.

16. A method of making a reflective article, comprising:
    providing a transparent glass substrate having a first major surface configured to face incident radiation and a second major surface configured to face opposite a direction of incident radiation;
    forming an inorganic basecoat over at least a portion of the second major surface, wherein the basecoat comprises at least one metal oxide selected from alumina, titania, zirconia, zinc oxide, zinc stannate, tin oxide, or mixtures or combinations thereof, and wherein the basecoat has a thickness in the range of 0.1 nm to 5 nm;
    forming a primary reflective coating over at least a portion of the basecoat, wherein the primary reflective coating comprises at least one metal selected from platinum, iridium, osmium, palladium, aluminum, gold, copper, silver, or mixtures, alloys, or combinations thereof, and wherein the primary reflective coating has a thickness in the range of 50 nm to 500 nm, and wherein the primary reflective coating is opaque to visible light;
    forming a metallic anti-corrosion coating over at least a portion of the primary reflective coating, wherein the anti-corrosion coating comprises a nickel-containing metal alloy, and has a thickness in the range of 20 nm to 40 nm;
    forming a top coat over at least a portion of the anti-corrosion coating, wherein the top coat comprises at least one layer comprising a material selected from metal oxides, nitrides, oxynitrides, borides, fluorides, or carbides, and wherein the top coat has a thickness in the range of 5 nm to 500 nm;

forming an inorganic protective coating over at least a portion of the top coat, wherein the protective coating comprises a mixture of silica and alumina and has a thickness in the range of 50 nm to 500 nm; and heating the coated substrate to a temperature of at least 1000° F. to bend or heat treat the article, wherein the reflective article has a higher hemispherical solar-weighted, integrated Rg reflectance after the heating step than before the heating step.

17. The method of claim 16, including forming an encapsulation structure over at least a portion of the protective coating after the heating step, wherein the encapsulation structure comprises a polymeric material and wherein the first major surface is free of the encapsulation structure.

18. The reflective article made by the method of claim 1 comprising:

said transparent glass substrate having said first major surface and said second major surface;

said basecoat positioned on at least said portion of the second major surface of said transparent glass substrate;

said primary reflective coating positioned on at least a portion of the basecoat, wherein said primary reflective coating is opaque to visible light;

said anti-corrosion coating positioned on the primary reflective coating, wherein said anti-corrosion coating comprises at least one of nickel and a nickel-containing alloy, and said anti-corrosion coating has a thickness in the range of 20 nm to 40 nm; and said inorganic protective coating positioned over at least a portion of the anti-corrosion coating.

* * * * *